(12) United States Patent
Johnson et al.

(10) Patent No.: US 7,255,746 B2
(45) Date of Patent: Aug. 14, 2007

(54) NITROGEN SOURCES FOR MOLECULAR BEAM EPITAXY

(75) Inventors: Ralph H. Johnson, Murphy, TX (US); Jin K. Kim, St. Louis Park, MN (US); James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 624 days.

(21) Appl. No.: 10/233,625

(22) Filed: Sep. 4, 2002

(65) Prior Publication Data

US 2004/0040495 A1 Mar. 4, 2004

(51) Int. Cl.
*C30B 25/12* (2006.01)
*C30B 25/14* (2006.01)

(52) U.S. Cl. .................. 117/104; 117/92; 117/103; 438/46; 438/57; 438/604

(58) Field of Classification Search .................. 117/92, 117/103
See application file for complete search history.

(56) References Cited

U.S. PATENT DOCUMENTS

| | | | | |
|---|---|---|---|---|
| 5,689,123 A | * | 11/1997 | Major et al. | 257/190 |
| 6,130,147 A | * | 10/2000 | Major et al. | 438/604 |
| 6,342,405 B1 | * | 1/2002 | Major et al. | 438/46 |
| 6,787,385 B2 | * | 9/2004 | Barber et al. | 438/57 |
| 2001/0030319 A1 | | 10/2001 | Takahashi et al. | |

FOREIGN PATENT DOCUMENTS

| | | |
|---|---|---|
| EP | 0822630 A | 2/1998 |
| EP | 0896406 A | 2/1999 |
| EP | 0989204 A | 3/2000 |
| EP | 0993027 A | 4/2000 |
| JP | 04331793 | 11/1992 |
| JP | 05029220 | 2/1993 |

OTHER PUBLICATIONS

Notification of Transmittal of the International Search Report or the Declaration, dated Jan. 20, 2004, relative to PCT. Application No. PCT/US03/27463, the foreign equivalent to the instant U.S. Appl. No. 10/233,625.
Araki T et at: "Structural Characterization of Gan Growth by Hydrogen-Assisted ECR-MBE Using Electron Microscopy" Journal O Crystal Growth, Nothr-Holland Publishing Co. Amsterdam, NL, vol. 209, No. 2-3 Feb. 2000, pp. 368-372, XP004186706 ISSN: 0022-0248.
Nishide'S et al: "Study of the Pyrolysis of Tertiarybutylhdrazide and GaN Fil Growth" Journal of Crystal Growth, North-Holland Publishing, Amsterdam, NL vol. 189-190, Jun. 15, 1998, pp. 325-329, XP004148527 ISSN: 0022-0248.

\* cited by examiner

*Primary Examiner*—Felisa Hiteshew
(74) *Attorney, Agent, or Firm*—Workman Nydegger

(57) ABSTRACT

MBE nitrogen sources of dimethylhydrazine, tertiarybutlyhydrazine, nitrogentrifloride, and NHx radicals. Those nitrogen sources are beneficial in forming nitrogen-containing materials on crystalline subtrates using MBE. Semiconductor lasers in general, and VCSEL in particular, that have nitrogen-containing layers can be formed using such nitrogen sources.

19 Claims, 3 Drawing Sheets

NITROGEN SOURCES FOR MOLECULAR BEAM EPITAXY

CROSS-REFERENCE TO RELATED APPLICATIONS

Not applicable.

BACKGROUND OF THE INVENTION

1. Field of the Invention

The present invention generally relates to the field of molecular beam epitaxy (MBE). More specifically, the present invention relates to MBE nitrogen sources.

2. Discussion of the Related Art

Molecular beam epitaxy (MBE) is a well-established method of forming thin film depositions on crystalline substrates. The MBE process is performed by heating a crystalline substrate in a vacuum so as to energize the substrate's lattice structure. Then, an atomic or molecular mass beam(s) is directed onto the substrate's surface. When the directed atoms or molecules arrive at the substrate's surface the directed atoms or molecules encounter the substrate's energized lattice structure. The energetic lattice structure then accepts oncoming atoms, possibly after those atoms are separated and removed from molecule. Over time, the oncoming atoms form a film that is characterized by high crystallinity and excellent surface uniformity. Because of its utility and the high quality films produced, MBE is widely used in semiconductor research and in fabricating semiconductor devices, particularly semiconductor devices that benefit from thin-film depositions of elemental materials.

FIG. 1 illustrates an MBE apparatus in operation. As shown, the MBE apparatus includes a chamber 106. During operation, that chamber 106 is ultra highly evacuated. An effusion cell 100 then injects a beam 104 of gaseous atoms or molecules 102 into the chamber 106. The beam 104 is directed at a predetermined angle toward a heated crystalline substrate 110 that is mounted in the chamber 106.

Effusion cells 100 come in a variety of configurations that are beneficially tailored for the specific material(s) being deposited. Effusion cells 100 include a crucible 111 that contains an effusion material 112, for example aluminum, gallium, indium, or other compounds. The crucible 111 and its contents are then heated to effuse the material from an orifice 114 into the chamber 106 and onto the substrate 110. The intensity of the beam 104 is controlled by the temperature of the crucible 111, which is set by a heater 115 (not shown in FIG. 1, but see FIG. 3), and by a shutter 108 positioned in the chamber 106 near the orifice 114. The ultra-high vacuum environment (UHV) used in MBE is typically about $1 \times 10^{-3}$ Pa. This enables a relatively low substrate temperature, typically about 750° C.

High purity gases, such as hydrogen, and high vapor pressure materials, such as arsenic, phosphorous, selenium, and sulfur, may be effused by thermally cracking them into dimers or into various atomic species. With gaseous materials, a valve can be used instead of the shutter 108 to control the intensity of the beam 104.

While FIG. 1 illustrates an MBE apparatus in operation, in practice a plurality of effusion cells 100 are used. In such cases, beams 104 from the individual effusion cells can be actuated individually or in conjunction with other beams to produce desired thin films on the substrate 110. In any event the species from the effusion cells travel across the MBE chamber 106 to the substrate 110. There, epitaxial growth occurs according to the controlling deposition kinetics.

MBE has proven useful for producing a wide range of epitaxial films. Of particular interest to the present invention are thin films that contain nitrogen. For example, FIG. 2 illustrates a vertical cavity surface emitting laser (VCSEL) having a nitrogen-containing layer that is suitable for MBE fabrication. As shown, an n-doped gallium arsenide (GaAs) or InP substrate 12 has an n-type electrical contact 14. An n-doped lower mirror stack 16 (a DBR) is on the substrate 12, and an n-type graded-index lower spacer 18 is disposed over the lower mirror stack 16. An active region 20 having a number of nitrogen containing quantum wells, for example GaInAsNSb, is formed over the lower spacer 18. A p-type graded-index top spacer 22 is disposed over the active region 20, and a p-type top mirror stack 24 (another DBR) is disposed over the top spacer 22. Over the top mirror stack 24 is a p-type conduction layer 9, a p-type cap layer 8, and a p-type electrical contact 26.

Still referring to FIG. 2, the lower spacer 18 and the top spacer 22 separate the lower mirror stack 16 from the top mirror stack 24 such that an optical cavity is formed. As the optical cavity is resonant at specific wavelengths, the mirror separation is controlled to resonate at a predetermined wavelength (or at a multiple thereof). At least part of the top mirror stack 24 includes an insulating region 40 that provides for current confinement. The insulating region 40 is usually formed either by implanting protons into the top mirror stack 24, or by forming an oxide layer. The insulating region 40 defines a conductive annular central opening 42 that forms an electrically conductive path through the insulating region 40.

In operation, an external bias cause an electrical current 21 to flow from the p-type electrical contact 26 toward the n-type electrical contact 14. The insulating region 40 and the conductive central opening 42 confine the current 21 such that it flows through the conductive central opening 42 to the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 2, the light 23 passes through the p-type conduction layer 9, through the p-type cap layer 8, through an aperture 30 in the p-type electrical contact 26, and out of the surface of the VCSEL 10.

While MBE has proven useful for producing nitrogen-containing layers, such as found in the VCSEL 10, the available nitrogen sources are less than optimal. In practice, two types of nitrogen sources are available: elemental nitrogen and ammonia. Elemental nitrogen is derived from nitrogen plasma, while ammonia is thermally cracked on a heated crystalline substrate (On-Surface Cracking) to produce elemental nitrogen. Because of limitations of available nitrogen sources, new MBE nitrogen sources would be beneficial.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

The principles of the present invention provide for new MBE nitrogen sources and their applications. By using nitrogen sources according to the principles of the present invention, nitrogen-containing thin films can be successfully deposited using MBE. Accordingly, the principles of the present invention further provide for a method of growing nitrogen-containing materials on a crystalline substrate using MBE. Such a method includes locating a crystalline substrate in a chamber, heating the crystalline substrate to a temperature suitable for MBE epitaxial growth, evacuating the chamber to a pressure suitable for MBE epitaxial growth, injecting a material selected form a group consisting of dimethylhydrazine, teritarybutylhydrazine, and nitrogentrifluoride, into the chamber through an effusion cell injector port, wherein the injected material is directed onto a surface of the crystalline substrate, whereby a nitrogen-containing layer results.

Alternatively, the injected material can include NHx radicals. Beneficially, the NHx radicals are formed such that a large oversupply of hydrogen results. This enables atomic hydrogen to act as a surfactant on the crystalline substrate during deposition. If required, the NHx radicals can be produced using a plasma source having a mixture of nitrogen and hydrogen.

Beneficially, the crystalline substrate is heated to a temperature of about 600° C. Also beneficially, the chamber is evacuated to a pressure of between $1 \times 10^{-2}$ to $1 \times 10^{-8}$ Pa.

A nitrogen-containing VCSEL can be formed using sources according to the principles of the present invention. To do so, a crystalline substrate is located in a chamber. That substrate is then heated and the chamber is evacuated to provide for MBE epitaxial growth. Various VCSEL layers are grown using standard materials until a nitrogen-containing layer is desired. Then, a material selected from a group consisting of dimethylhydrazine, tertiarybutylhydrazine, and nitrogentrifluoride, or a NHx radical compound, is injected into the chamber through an effusion cell injector port, wherein the injected material is directed onto the crystalline substrate, whereby a nitrogen-containing layer is formed.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE ILLUSTRATED EMBODIMENTS

Reference will now be made in detail to embodiments of the present invention. Such embodiments are suitable for fabricating nitrogen-containing layers, such as those used in VCSELs, on a crystalline substrate using MBE.

Figure 1:
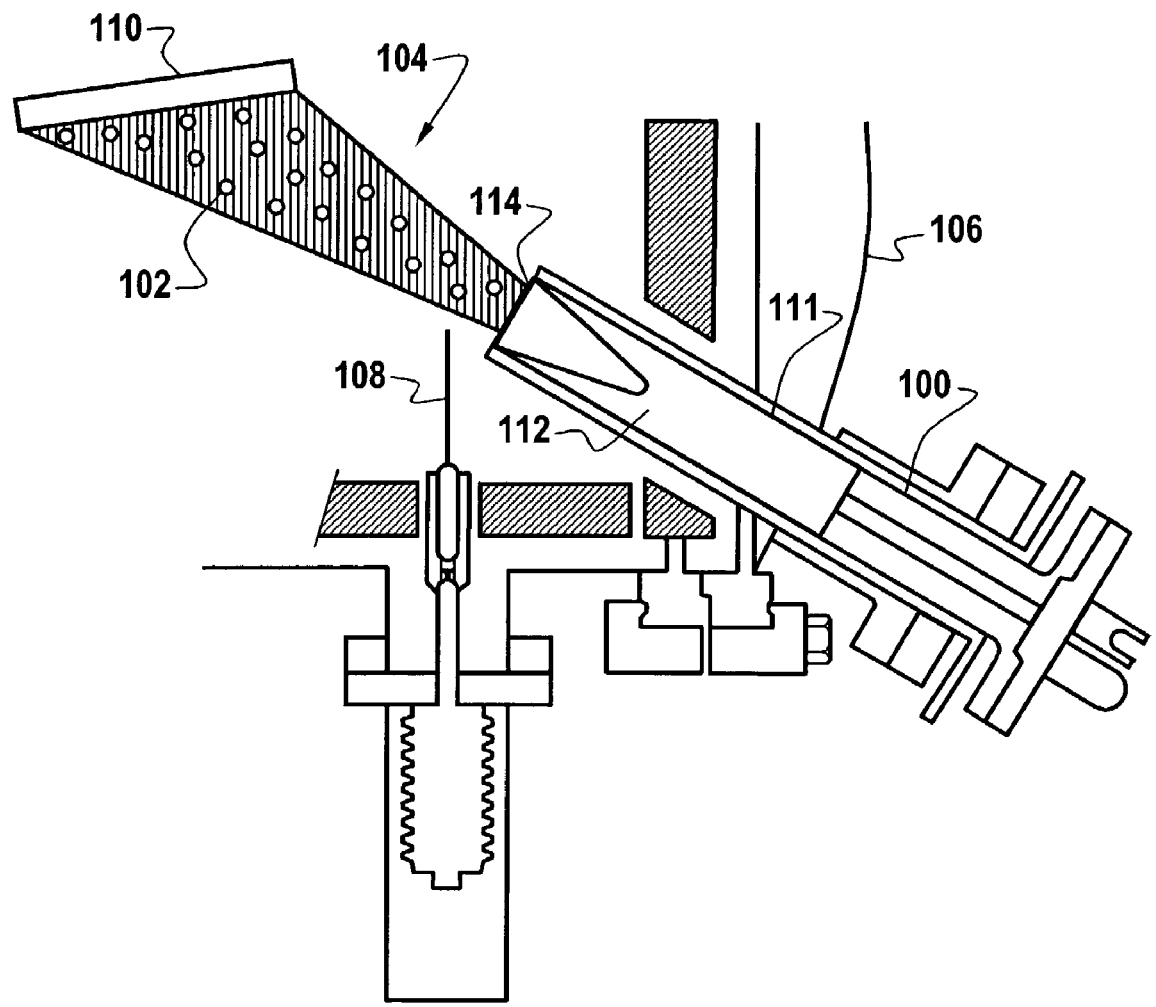
FIG. 1 illustrates an MBE apparatus in operation forming a thin-film.
Figure 2:
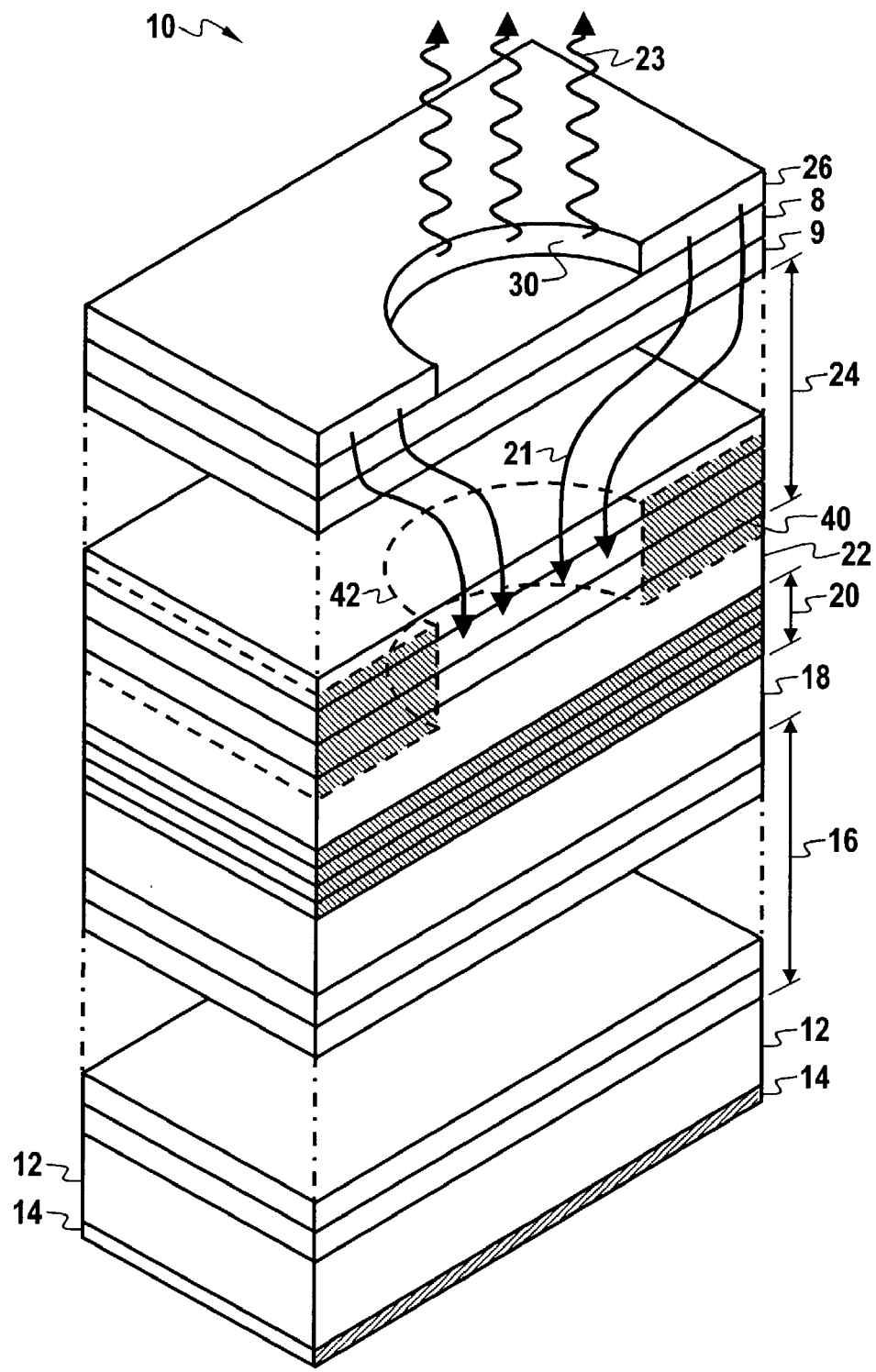
FIG. 2 illustrates a vertical cavity surface emitting laser having a nitrogen containing layer.

As previously described, FIG. 1 illustrates an MBE apparatus. Referring once again to FIG. 1, the crystalline substrate 110 is now considered to be a partially fabricated VCSEL, reference FIG. 2, onto which a nitrogen-containing layer is to be formed.

Figure 3:
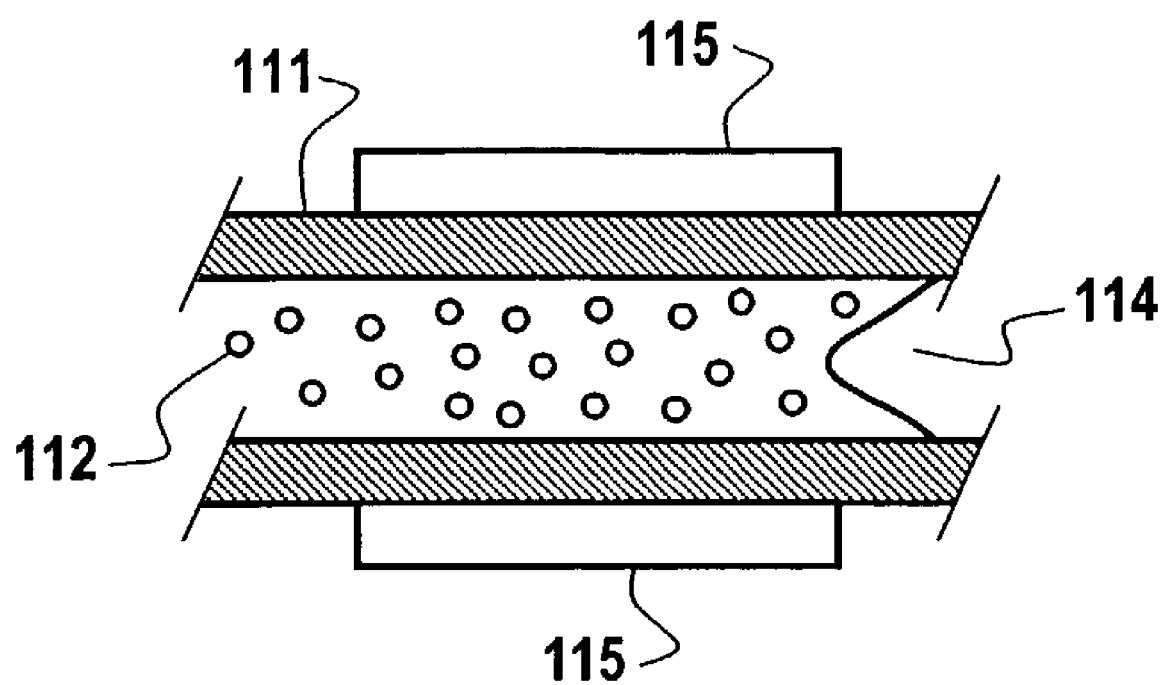
FIG. 3 illustrates a crucible containing effusion material that is in accord with the principles of the present invention.

Turning now to FIG. 3, the effusion cell's 100 crucible 111 contains an effusion material 112 that is in accord with the principles of the present invention. In particular, the effusion material 112 is dimethylhydrazine, tertiarybutylhydrazine, nitrogentrifluoride, or NHx radicals.

With dimethylhydrazine, tertiarybutylhydrazine, nitrogentrifluoride, or NHx radicals in the effusion cell 100 of FIG. 1, the heater 115 heats the contained material to the proper temperature. Turning back to FIG. 1, the chamber 106 is ultra highly evacuated and the crystalline substrate 110 is heated. The effusion cell 100 then injects a beam 104 of dimethylhydrazine, of tertiarybutylhydrazine, of nitrogentrifluoride, or of NHx radicals into the chamber 106 and onto the heated crystalline substrate 100. The result is a nitrogen-containing layer on the crystalline substrate 110.

Using standard procedure, the VCSEL 10 is then completed.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A method of performing molecular beam epitaxy, comprising:
   locating a crystalline substrate in a chamber;
   heating the crystalline substrate to a temperature suitable for MBE epitaxial growth;
   evacuating the chamber to a pressure suitable for MBE epitaxial growth; and
   injecting tertiarybutylhydrazine into the chamber and onto a surface of the crystalline substrate.

2. A method according to claim 1, wherein a nitrogen-containing layer is formed on the crystalline substrate.

3. A method according to claim 1, wherein the injected material is injected from an effusion cell.

4. A method according to claim 1, wherein the injected material forms a gaseous beam.

5. A method according to claim 1, wherein a nitrogen-containing layer is formed on a surface of the crystalline substrate.

6. A method according to claim 1, wherein a surplus of hydrogen is directed onto the surface of the crystalline substrate.

7. A method according to claim 6, wherein the hydrogen surplus acts as a surfactant on the surface of the crystalline substrate.

8. A method of fabricating a vertical cavity surface emitting laser comprising the steps of:
locating a crystalline substrate in a chamber;
heating the crystalline substrate to a temperature suitable for MBE epitaxial growth;
evacuating the chamber to a pressure suitable for MBE epitaxial growth; and
injecting tertiarybutylhydrazine into the chamber and onto a surface of the crystalline substrate.

9. A method according to claim 8, wherein a nitrogen-containing layer is formed on a surface of the crystalline substrate.

10. A method according to claim 8, wherein a surplus of hydrogen is directed onto the surface of the crystalline substrate.

11. A method according to claim 10, wherein the hydrogen surplus acts as a surfactant on the surface of the crystalline substrate.

12. A method according to claim 11, wherein the injected material is a plasma having nitrogen and hydrogen.

13. A method according to claim 8, wherein the injected material is injected from an effusion cell.

14. A method according to claim 13, wherein the injected material forms a gaseous beam.

15. A method of fabricating a semiconductor laser, comprising the steps of:
locating a crystalline substrate in a chamber;
heating the crystalline substrate to a temperature suitable for MBE epitaxial growth;
evacuating the chamber to a pressure suitable for MBE epitaxial growth;
growing at least one semiconductor layer on the crystalline substrate; and
injecting tertiarybutylhydrazine into the chamber and onto a surface of the crystalline substrate.

16. A method according to claim 15, wherein injecting a material forms a nitrogen-containing layer on the crystalline substrate.

17. A method according to claim 16, wherein the injected material is injected from an effusion cell.

18. A method according to claim 15, wherein the injecting the material forms a gaseous beam.

19. A method according to claim 15, further including completing the fabrication of a semiconductor laser.

* * * * *